United States Patent [19]

Ho et al.

[11] Patent Number: 4,733,058
[45] Date of Patent: Mar. 22, 1988

[54] FAIL TRANSISTOR DETECTION AND DISPLAY SYSTEM FOR ELECTRICAL DISCHARGE MACHINING APPARATUS

[75] Inventors: Kuang-Ta Ho, Charlotte; Oliver A. Bell, Jr., Statesville, both of N.C.

[73] Assignee: Colt Industries Inc., New York, N.Y.

[21] Appl. No.: 834,377

[22] Filed: Feb. 28, 1986

[51] Int. Cl.$^4$ .......................... B23H 1/02; H02H 3/00
[52] U.S. Cl. ...................... 219/69 S; 361/91
[58] Field of Search ............... 219/69 S, 69 P; 323/279; 363/58; 361/91, 88, 101; 307/130

[56] References Cited

U.S. PATENT DOCUMENTS

| | | | |
|---|---|---|---|
| 3,609,281 | 9/1971 | Kauffman | 219/69 S |
| 3,673,371 | 6/1972 | Smith et al. | 219/69 S |
| 3,697,719 | 10/1972 | Verner et al. | 219/69 S |
| 3,699,301 | 10/1972 | Losey | 219/69 S |
| 3,705,969 | 12/1972 | Bell, Jr. | 219/69 S |
| 3,748,569 | 7/1973 | Frank et al. | 361/91 |
| 3,825,713 | 7/1974 | Bell, Jr. | 219/69 S |
| 3,851,134 | 11/1974 | Takarada | 219/69 S |
| 3,884,790 | 5/1975 | Kobayashi et al. | 219/69 S |
| 4,363,068 | 12/1982 | Burns | 361/91 |
| 4,385,337 | 5/1983 | Asano et al. | 361/91 |
| 4,503,477 | 3/1985 | Henriksen et al. | 361/91 |
| 4,620,258 | 10/1986 | Bloomer | 361/91 |

FOREIGN PATENT DOCUMENTS

84/01915  5/1984  PCT Int'l Appl. .............. 219/69 S

Primary Examiner—A. D. Pellinen
Assistant Examiner—Geoffrey S. Evans
Attorney, Agent, or Firm—Harry R. Dumont

[57] ABSTRACT

An EDM circuit that detects power transistor switch failure. A comparator 62 and a sample and hold stage 60 are used during a window of time formed by the off-time of a pulse generator to determine whether power switch MOSFET 30 is conducting. If MOSFET 30 is conducting during the off-time of the pulse generator LED 72 will emit light to indicate a failed power transistor switch.

6 Claims, 2 Drawing Figures

FAIL TRANSISTOR DETECTION AND DISPLAY SYSTEM FOR ELECTRICAL DISCHARGE MACHINING APPARATUS

FIELD OF THE INVENTION

The present invention relates to the field of electrical discharge machining in which a workpiece is shaped by the process of electroerosion.

BACKGROUND ART

This invention is particularly applicable to the field of electrical discharge machining in which a tool electrode is opposed to an electrically conductive workpiece to form a gap through which a dialectric fluid is passed. A power supply is included to provide machining power pulses across the gap so that particles of the workpiece are removed responsive to each gap breakdown. The pulses are provided with controllable "on-off" time and frequency to control the overcut and finish of the operation. As material is removed from the workpiece, a servo feed system is employed to advance the electrode toward the workpiece and continue the machining operation. In electrical discharge machining, sometimes hereinafter referred to as EDM, pulses are passed at high frequency across the machining gap with provision for selectively adjusting both on or off time or frequency as these changes are desired. At some points of operation, failures occur in the power supply, particularly in the output stage or power switches of the power supply. It is necessary to monitor the condition of these power transistors to determine whether transistor or other component failures have occurred. In this manner, it is possible to replace the failed components so that the power supply will always be operating at the optimum efficiency and with predictable results. The present invention is one that checks the power transistors without reliance on any timimg elements. Instead it checks the power transistors during the "off" time and if there is a failure, a reliable indication of that condition is provided.

The present invention not only detects a transistor failure but displays where that transistor is with an LED light. If any transistor turns on during normal "off" time, there will be a signal and the output will go to ground. An indication that the transistor is continuing to conduct during the "off" time provides a reliable proof that the transistor or something in the drive line has failed. An indicator light can be mounted on the machine to show when this condition has occurred so the corrective replacement can be made.

BRIEF DESCRIPTION OF THE DRAWINGS

The present invention will now be described with reference to the accompanying specification and the drawings in which like numerals are used to refer to like elements in the several views and in which.

BEST MODE OF CARRYING OUT THE INVENTION

Figure 1:
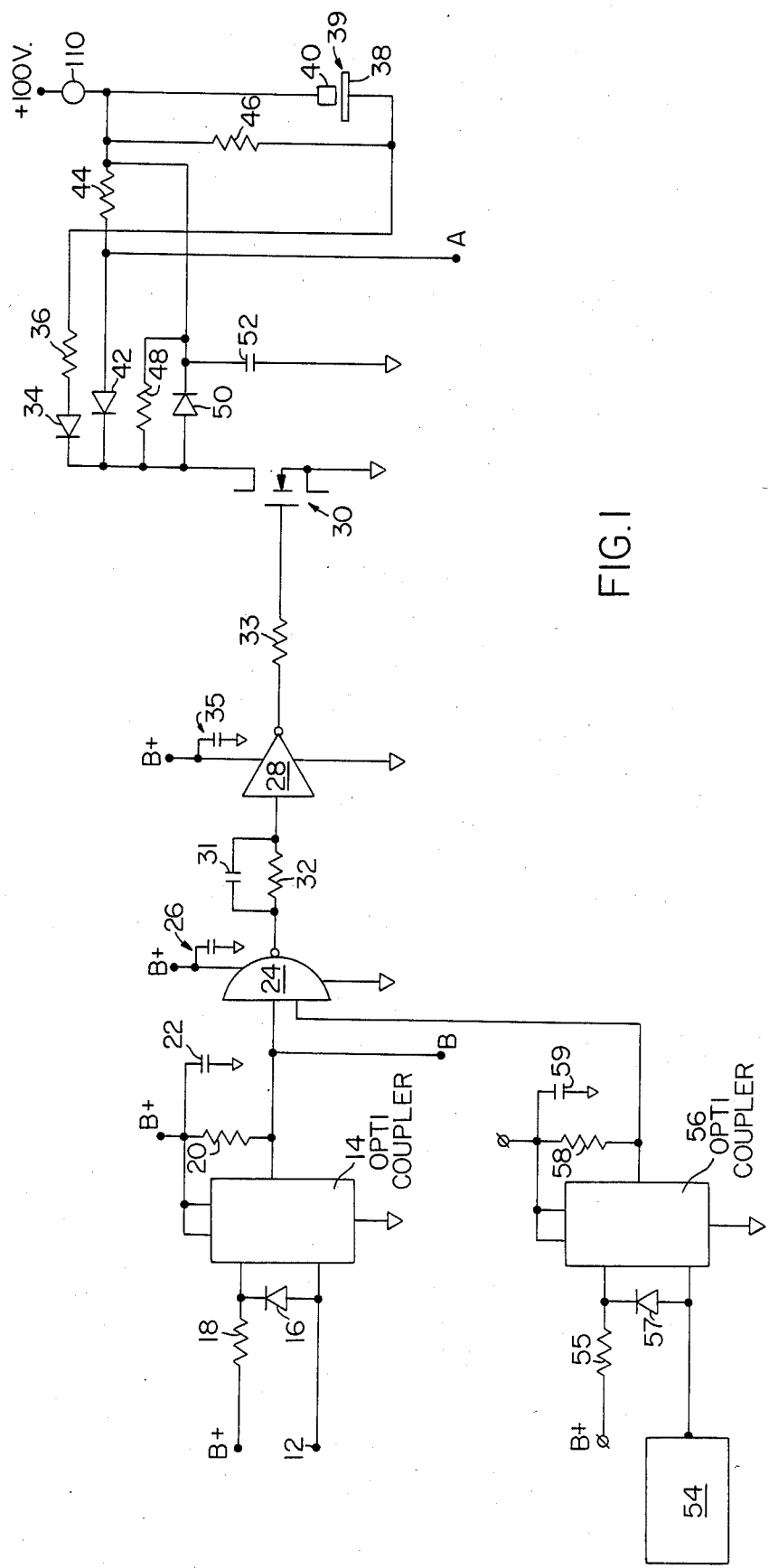
FIG. 1 is a schematic drawing showing the basic operating parts of an EDM power supply and the points at which the transistor failure detection signals are sensed.

A pulse generator is used to control the machining power pulses. It may be embodied as a free running multivibrator or as a digitally controlled multivibrator.

A drive stage is indicated by the numeral 12 as shown and the following network in the drive line includes an opticoupler stage 14, its input network including a diode 16 and a resistor 18. A load resistor 20 and a bypass capacitor 22 are connected to opticoupler 14. The next following stage is a NAND gate 24 whose other input comes from current control 54.

Current control 54 will be high or low depending on how many additional drive stages and output stages are included in the power supply. An opticoupler 56 with its input network comprising a diode 57 and a resistor 55b is included. A load resistor 58 and capacitor 59 are connected to the opticoupler 56. A pulse shaping network is connected between the output of the NAND gate 24 and an amplifier driver 28. The pulse forming includes a capacitor 31 and a resistor 32. The output or power transistor is embodied as a MOSFET 30. A signal resistor 33 is connected between the output of the amplifier driver 28 and the input terminal of the MOSFET 30. It will be understood that the EDM power supply may include a plurality of additional drive stages and output switches in accordance with the current capability required for the power supply.

The output from the drain of the MOSFET 30 includes a diode 34 and resistor 36 network which is connected to the EDM gap 39 which includes a workpiece 38 and an electrode 40. The DC power supply for the EDM operation is indicated as a plus 100 volt source.

Also connected to the drain of the MOSFET 30 is an OR gate network including a diode 42 and a resistor 44 also connected to the EDM machining gap. A shunt resistor 46 is shown connected across the EDM gap 39. Also connected to the drain of the MOSFET 30 is a snubber network including a diode 50 and a capacitor 52 coupled to ground as shown.

The signals required in the failed transistor detection display circuit as shown located at point B which represents the drive signal at point A which represents the output of the MOSFET switch 30. The manner in which these signals are used in the detection and indication function will be shown in FIG. 2 hereinafter.

Figure 2:
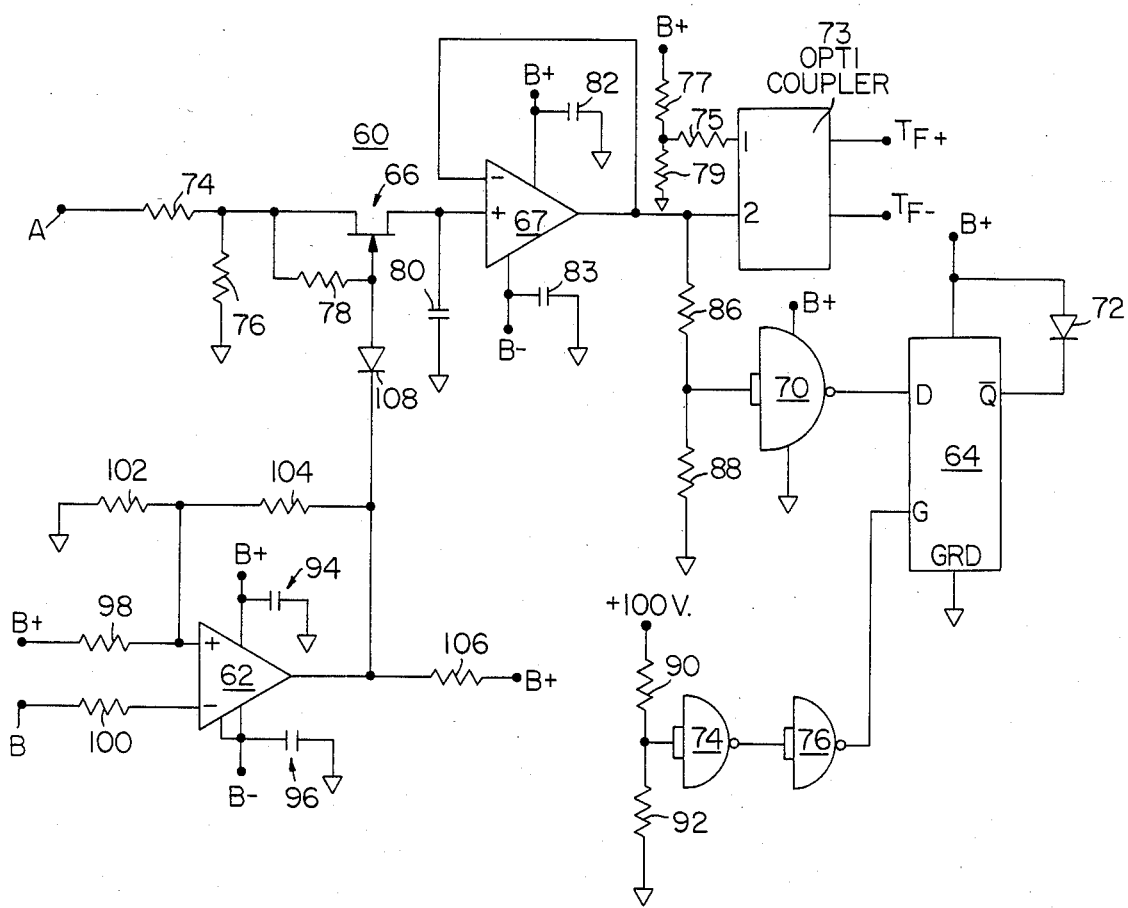
FIG. 2 is a combined block diagrammtic and schematic showing of the transistor failure detection and display circuit.

The principal parts of the failure detection display circuit of FIG. 2 includes a sample and hold stage 60, a comparator 62 and a latch 64.

The signal coming off the MOSFET transistor 30 drain passes through the OR gate network shown in FIG. 1. If any transistor 30 turns on during the "off" time, the voltage at point A will be at ground or close to it. The ground line A will thus be close to ground whenever any transistor shorts.

The comparator 62 takes off the drive signal B and turns on the transistor 66 which will pass whatever voltage occur during the "off" time when it operates. It only detects during the "off" time. Its output signal is passed through the voltage follower 67. If at any time during an "off" time, the input to the voltage follower 67 goes to ground because of a failed transistor, then its output will go to ground and then be inverted by inverter 70 and cause the output at input D of latch 64 to go high. The latch 64 is in a condition such that whatever is on the D input will be transferred when G is high and will be latched at its output when G becomes low. The input to the G input terminal of the latch 64 comes from a pair of gates 74 and 76 as shown so that when power is initially turned on the G will be high. If there is no failed condition during power on, the D is low and the G is high. However, if you have a failed transistor subsequently, the LED 72 will be on to indicate failed condition. A transistor fail signal TF+ TF− will be sent out through an opticoupler 73 to turn off the main 100 v power supply at the same time through a relay 10 as shown. The opticoupler 73 includes a B+ bias supply and resistors 75, 77 and 79 connected to its input. Resistors 74 and 76 are connected to the input or the transistor 66 as a voltage divider. A sample and hold capacitor 80 is connected to the output of transistor 66 as shown. External bypass networks 82 and 83 are connected to the input of the inverter 74 as voltage dividers.

The comparator 62 includes a pair of external bypass networks 94 and 96. Signal resistor 100 is connected to the negative input of the comparator 62. A resistor network including resistors 98 and 102 provides a reference voltage at the positive terminal of the comparator 62. Resistor 104 serves as a hysteresis. The condition of the transistor 66 is keyed through a diode 108.

It will thus be seen that we have provided by our invention an improved detection and indication transistor fail circuit for use with electrical discharge machining apparatus. There is a ready indication of output transistor failure. Also the indication is prevented on initial turn-on of the power supply unless there is a failure.

We claim:

1. In an electrical discharge machining apparatus including an electronic power switch and a power supply connected to a gap and a drive circuit for periodically turning said switch on and off for providing machining power pulses to the gap, a system for detecting power switch failure, comprising:
   detecting means coupled to said electronic switch for responding to its conduction;
   means for keying the operation of said detecting means only during normal pulse off time of said power switch;
   indicating means operatively connected to the output of said detecting means for providing a visual failure signal responsive to conduction during normal off time.

2. The combination as set forth in claim 1 in which said keying means comprises a network coupled to the drive circuit of said electronic power switch.

3. The combination as set forth in claim 1 in which said detecting means is connected between the output of said electronic power switch and a comparator.

4. The combination as set forth in claim 3 in which a transistor is operably connected between said detecting means, said transistor keyed into conduction during said switch off time.

5. The combination as set forth in claim 3 in which said indicating means comprises an LED connected to the output of said comparator.

6. The combination as set forth in claim 1 in which said means for keying include a sample and hold stage coupled to the drive circuit for said electronic power switch.

* * * * *